United States Patent
Rim et al.

(10) Patent No.: US 11,456,395 B2
(45) Date of Patent: Sep. 27, 2022

(54) INTERCONNECTION OF SOLAR CELLS IN A SOLAR CELL MODULE

(71) Applicant: SUNPOWER CORPORATION, San Jose, CA (US)

(72) Inventors: Seung Rim, Palo Alto, CA (US); Sung Dug Kim, Pleasanton, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 16/749,776

(22) Filed: Jan. 22, 2020

(65) Prior Publication Data

US 2020/0161490 A1 May 21, 2020

Related U.S. Application Data

(63) Continuation of application No. 13/972,124, filed on Aug. 21, 2013, now Pat. No. 10,553,738.

(51) Int. Cl.
| | |
|---|---|
| *H01L 31/05* | (2014.01) |
| *H01L 31/048* | (2014.01) |
| *H01L 31/068* | (2012.01) |
| *H01L 31/18* | (2006.01) |

(52) U.S. Cl.
CPC ........ *H01L 31/0504* (2013.01); *H01L 31/048* (2013.01); *H01L 31/0682* (2013.01); *H01L 31/1892* (2013.01); *Y02E 10/547* (2013.01)

(58) Field of Classification Search
CPC ............... H01L 31/0504; H01L 31/048; H01L 31/1892; H01L 31/0682; H01L 31/0516
See application file for complete search history.

(56) References Cited

U.S. PATENT DOCUMENTS

| | | | |
|---|---|---|---|
| 2009/0114276 A1* | 5/2009 | Shan | H01L 31/0516 257/E21.001 |
| 2010/0051085 A1* | 3/2010 | Weidman | H01L 31/02245 136/244 |
| 2010/0200058 A1* | 8/2010 | Funakoshi | H01L 31/049 156/60 |
| 2011/0048506 A1 | 3/2011 | Pichler | |

FOREIGN PATENT DOCUMENTS

| | | | |
|---|---|---|---|
| JP | 2009-076849 A | 4/2009 | |
| JP | 2011-054831 A1 * | 3/2011 | ..... H01L 31/022441 |
| KR | 10-2013-0027535 | 3/2013 | |

OTHER PUBLICATIONS

JP 2011-054831 A1 online machine translation, translated on Dec. 3, 2020.*
Definition of "Tape" as provided by Google, Accessed on Dec. 4, 2020.*

* cited by examiner

*Primary Examiner* — Golam Mowla
(74) *Attorney, Agent, or Firm* — Grasso PLLC

(57) ABSTRACT

A solar cell module includes serially connected solar cells. A solar cell includes a carrier that is attached to the backside of the solar cell. Solar cells are attached to a top cover, and vias are formed through the carriers of the solar cells. A solar cell is electrically connected to an adjacent solar cell in the solar cell module with metal connections in the vias.

18 Claims, 6 Drawing Sheets

INTERCONNECTION OF SOLAR CELLS IN A SOLAR CELL MODULE

CROSS-REFERENCE TO RELATED APPLICATION

The present application is a continuation of U.S. application Ser. No. 13/972,124, filed on Aug. 21, 2013, now U.S. Pat. No. 10,553,738, which is incorporated herein by reference in its entirety.

TECHNICAL FIELD

Embodiments of the subject matter described herein relate generally to solar cells and solar cell modules.

BACKGROUND

Solar cells are well known devices for converting solar radiation to electrical energy. A solar cell has a front side that faces the sun during normal operation to collect solar radiation and a backside opposite the front side. Solar radiation impinging on the solar cell creates electrical charges that may be harnessed to power an external electrical circuit, such as a load. Solar cells may be electrically connected to form a solar cell array. The solar cell array may be packaged to form a solar cell module, which may then be deployed in the field along with other solar cell modules.

BRIEF SUMMARY

In one embodiment, a solar cell module includes serially connected solar cells. A solar cell includes a carrier that is attached to the backside of the solar cell. Solar cells are attached to a transparent top cover, and vias are formed through the carriers of the solar cells. The vias are filled with metal connections that electrically connect a solar cell to an adjacent solar cell in the solar cell module.

These and other features of the present disclosure will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures. The figures are not drawn to scale.

DETAILED DESCRIPTION

Figure 1:
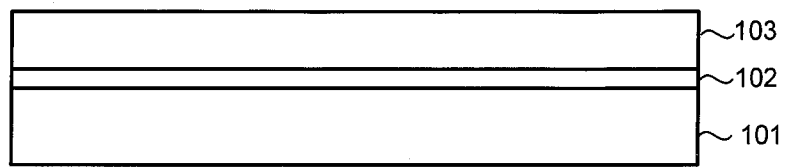
FIGS. 1-5 show cross-sections that schematically illustrate fabrication of a solar cell in accordance with an embodiment of the present disclosure.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"First," "Second," etc. As used herein, these terms are used as labels for nouns that they precede, and do not imply any type of ordering (e.g., spatial, temporal, logical, etc.). For example, reference to a "first" via does not necessarily imply that this via is the first via in a sequence; instead the term "first" is used to differentiate this via from another via (e.g., a "second" via).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

FIGS. 1-5 show cross-sections that schematically illustrate fabrication of a solar cell in accordance with an embodiment of the present disclosure. In the example of FIGS. 1-5, the solar cell being fabricated is a thin epitaxial silicon all back contact solar cell, in that all the P-type and N-type doped regions of the solar cell and the metal contacts electrically connected to the P-type and N-type doped regions are on the backside of the solar cell. The substrate of the solar cell being fabricated is an epitaxial silicon layer, instead of a silicon wafer. A solar cell has a plurality of P-type and N-type doped regions but only some of the P-type and N-type doped regions are shown in the following examples. Additional P-type and N-type doped regions and other features of the solar cell are not shown for clarity of illustration.

Referring first to FIG. 1, a sacrificial silicon layer 102 is formed on a backside surface of a handle wafer 101. The handle wafer 101 may comprise pure silicon, doped, or compound silicon wafer. The handle wafer 101 facilitates handling of the solar cell during processing of device elements on the backside of the solar cell, such as P-type and N-type doped regions and metal contacts to the P-type and N-type doped regions. The handle wafer 101 is not the substrate of the solar cell and is separated from the solar cell in a subsequent release process.

The sacrificial layer 102 may comprise porous silicon, which is formed by exposing the backside surface of the handle wafer 101 in a hydrofluoric acid bath with bias. The sacrificial layer 102 may also comprise silicon with, for example, germanium doping and/or a carbon doping, either of which may be formed by epitaxial deposition or a chemical vapor deposition (CVD) process. The sacrificial layer 102 is relatively thin, e.g., on the order of approximately 700 micrometers, to facilitate subsequent release of the handle wafer 101 from the solar cell being fabricated. As can be appreciated, the thickness and composition of the sacrificial layer 102 may be varied depending on the particulars of the solar cell fabrication process. For example, the sacrificial layer 102 may be as thin as 10 micrometers in some embodiments.

The epitaxial silicon layer 103 may be grown directly on the backside surface of the sacrificial layer 102 by a kerfless epitaxial growth process. The epitaxial silicon layer 103 is also referred to as "thin silicon film" in that it is relatively thin compared to a silicon wafer. For example, the epitaxial silicon layer 103 may be grown to a thickness of 20 μm to 150 μm (e.g., 50 μm).

Figure 2:
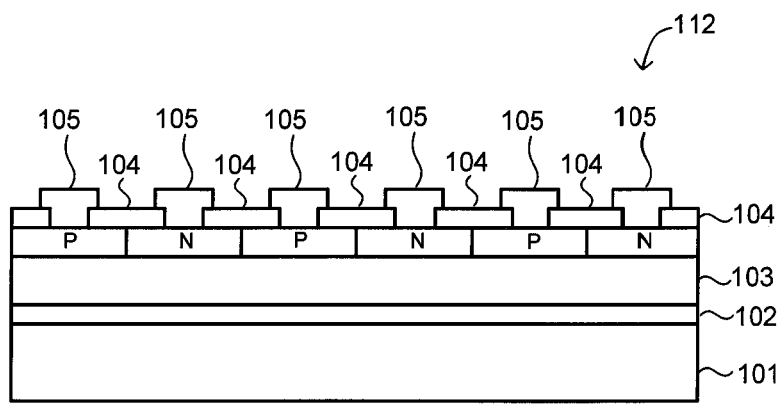

FIG. 2 shows the P-type and N-type doped regions (labeled as "P" and "N") formed on the backside (see arrow 112) of the solar cell being fabricated. The backside is opposite the front side (see arrow 113). The front side of the solar cell is also referred to as the "sun side" in that it is directed towards the sun during normal operation to collect solar radiation.

The P-type and N-type doped regions may be formed within or external to the epitaxial silicon layer 103. For example, the P-type and N-type doped regions may be formed by diffusing P-type and N-type dopants into the epitaxial silicon layer 103. As another example, the P-type and N-type doped regions may be formed in a polysilicon layer that that is formed on the backside surface of the epitaxial silicon layer 103. P-type and N-type dopants are then diffused into the polysilicon to form the P-type and N-type doped regions. The polysilicon may also be pre-doped with P-type and N-type dopants.

One or more dielectric layers 104 may be formed on the P-type and N-type doped regions. For example, a dielectric layer 104 serving as a backside anti-reflective coating (e.g., silicon nitride) may be formed on the P-type and N-type doped regions. Contact holes that expose the P-type and N-type doped regions are formed through the dielectric layer 104. Metal contacts 105 are formed in the contact holes to electrically connect to corresponding P-type and N-type doped regions. Metal pads (e.g., see FIGS. 6-11, pads 203), or other nodes that connect a plurality of metal contacts, may be formed during the metallization process that forms the metal contacts 105. The metal contacts 105 may be formed by plating, sputtering, printing, or other metallization process. The handle wafer 101 facilitates handling of the solar cell being fabricated during formation of the P-type and N-type doped regions, the dielectric layer 104, and the metal contacts 105.

Figure 3:
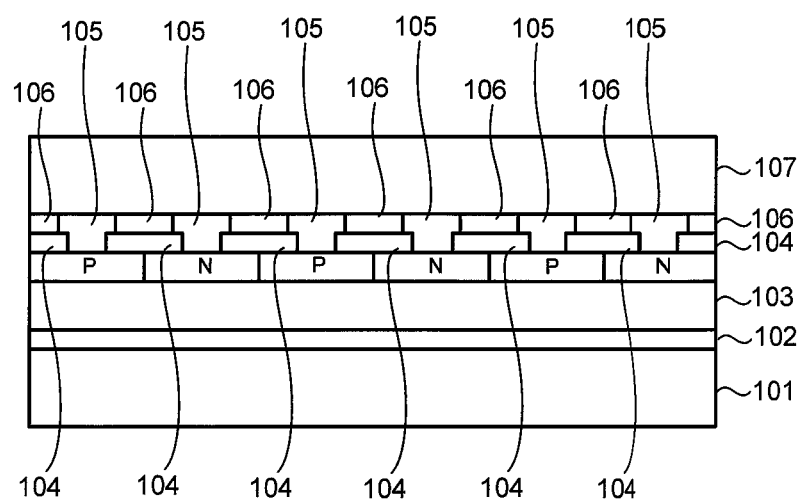

FIG. 3 shows a carrier 107 attached on the backside of the solar cell. In the example of FIG. 3, a bonding agent 106 is applied on the backside of the solar cell, on the dielectric layer 104 and on the metal contacts 105. The carrier 107 is then pressed against the bonding agent 106, thereby bonding the carrier 107 to the backside of the solar cell. The carrier 107 may comprise a structure that has sufficient rigidity and, in some embodiments, flatness, to support the solar cell during the subsequent release process. The carrier 107 may comprise an optically transparent dielectric material to allow for alignment (e.g., automated optical inspection (AO') alignment) in a laser process to form vias through the carrier 107. For example, the carrier 107 may comprise polyimide that is about 1 μm to 250 μm thick. The carrier 107 may also comprise organic materials (e.g., polyethylene terephthalate), composite materials with resin and fibers, inorganic materials (e.g., silicon carbide), etc. In embodiments where the carrier 107 comprises an opaque material, fiducial marks may be formed on the carrier 107 for alignment. Alignment may also be performed by aligning the edges of the carrier 107 or the epitaxial silicon layer 103. The carrier 107 may have an area that is slightly wider than that of the device portion of the solar cell (e.g., see FIG. 6). That is, the carrier 107 may have an area that extends past the perimeter of the device portion of the solar cell. It is to be noted that unlike an interlayer dielectric, the carrier 107 has no metal fingers on top of it. As shown in FIG. 3, the metal contacts 105, which may include the metal fingers of the solar cell, are between the carrier 107 and the doped regions.

Figure 4:
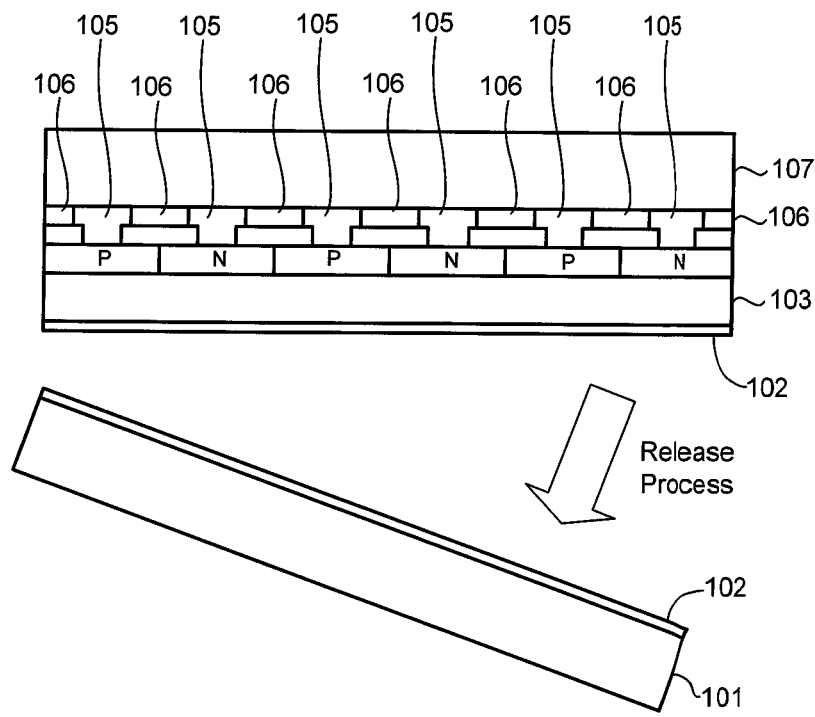

FIG. 4 shows the handle wafer 101 being released from the rest of the solar cell being manufactured. In the example of FIG. 4, a mechanical or electro-chemical release process breaks the sacrificial layer 102 to separate the handle wafer 101 from the epitaxial silicon layer 103. The release process may partially or fully destroy the sacrificial layer 102 to release the handle wafer 101 from the epitaxial silicon layer 103. The release process may be a selective etch process, including wet etch processes, for example. The carrier 107 advantageously allows for handling of the solar cell and protects the backside of the solar cell, including the metal contacts 105, during the release process. The bonding agent 106 also provides additional protection to the metal contacts 105 during the release process and other subsequent processing, including during texturing of the front side of the solar cell.

Portions of the sacrificial layer 102 may remain on the surface of the epitaxial silicon layer 103 and/or the surface of the handle wafer 101 after the release process. Sacrificial layer 102 remaining on the handle wafer 101 may be re-used to grow another epitaxial silicon layer of another solar cell. In that case, the surface of the sacrificial layer 102 may be washed or cleaned prior to re-use. The sacrificial layer 102 may also be dissolved entirely, requiring a new sacrificial layer to be formed on the handle wafer 101 for re-use.

Figure 5:
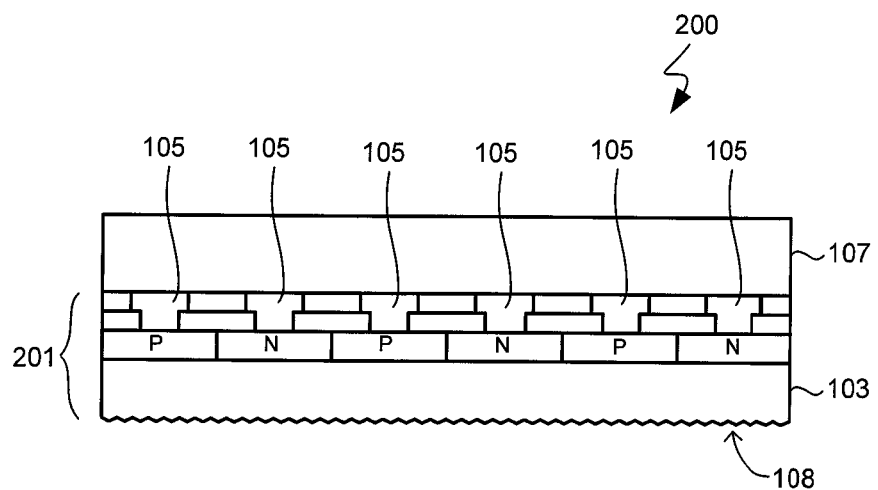

FIG. 5 shows texturing of the front side surface of the solar cell to form a textured front side surface 108. The texturing process may form random pyramids on the surface of the epitaxial silicon layer 103, or on the surface of the sacrificial layer 102 in the case where the sacrificial layer 102 is not fully removed from the epitaxial silicon layer 103. The texturing process may comprise a wet or dry etch process, including buffered oxide etching (BOE) to create the textured front side surface 108. One etchant that may be used for the texturing process is potassium hydroxide, for example. The textured front side surface 108 may have a regular, repeating pattern, such as triangular or rectangular pyramids, or may have a randomly determined pattern.

The carrier 107 advantageously protects the backside of the solar cell (which includes the metal contacts 105) during the texturing process and other front side processing, including formation of passivation regions on the front side. In some embodiments, the texturing process may be performed at a temperature less than 400° C. Generally speaking, the texturing process is performed at a temperature that is compatible with the material of the carrier 107. For example, with a, carrier 107 that comprises polyimide, the texturing process can be performed at a temperature that is less than or equal to approximately 200° C.

In FIG. 5, the fabricated solar cell, now referred to as "solar cell 200", comprises a device portion 201 and the carrier 107. The device portion 201 comprises the main electrical elements of the solar cell 200, including the epitaxial silicon layer 103, the P-type and N-type doped regions, and metal contacts 105. The carrier 107 remains on the backside of the solar cell 200, being bonded to the backside surface of the device portion 201. FIG. 5 schematically shows the solar cell 200 at the end of the solar cell fabrication process, which is also referred to as "cell level" manufacturing.

Although usable by itself, a solar cell is typically packaged with other solar cells in a solar cell module. At "module level" manufacturing, the solar cell is serially connected to other solar cells and enclosed in a protective package to protect the solar cells from environmental conditions. One problem with thin epitaxial silicon solar cells is that they are relatively difficult to handle, especially during metallization to electrically connect the solar cells together. As will be more apparent below, the carrier 107 not only protects and facilitates handling of the solar cell during manufacture at the cell level, but also facilitates handling of the solar cell and electrical connection of the solar cell to other solar cells at the module level. In addition, the carrier 107 does not have to be removed from the device portion 201, advantageously eliminating a de-bonding step.

FIGS. 6-9 show cross-sections that schematically illustrate fabrication of a solar cell module in accordance with an embodiment of the present disclosure.

Figure 6:
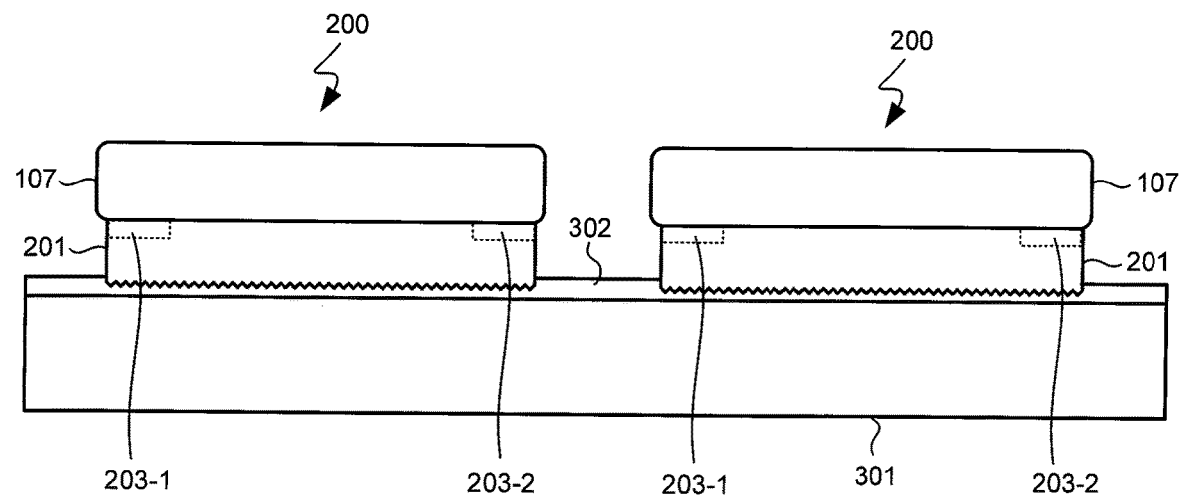
FIGS. 6-9 show cross-sections that schematically illustrate fabrication of a solar cell module in accordance with an embodiment of the present disclosure.

Referring to FIG. 6, an encapsulant 302 is placed on a transparent top cover 301 of the solar cell module being fabricated. In one embodiment, the transparent top cover 301 comprises glass. A plurality of solar cells 200 are placed on the encapsulant 302, with the front sides of the solar cells 200 contacting the encapsulant 302. The solar cells 200 are packaged with the encapsulant 202 and the transparent top cover 201 by, for example, laminating the solar cells 200, the encapsulant 202, and the transparent top cover 201 together. As deployed in the field, the solar cell module is oriented such that the transparent top cover 301 faces the sun to allow solar radiation to reach the front sides of the solar cells 200.

Each solar cell 200 comprises a device portion 201 with an attached carrier 107 as previously discussed. The P-type and N-type doped regions and other previously discussed features of a device portion 201 are not shown in FIGS. 6-9 for clarity of illustration. A solar cell module typically has a plurality of solar cells, but only two are shown in FIGS. 6-9 for clarity of illustration.

FIG. 6 also schematically shows the metal pads 203 (i.e., 203-1, 203-2) of each solar cell 200. A metal pad 203 provides a relatively large area that provides a common connection node for a plurality of doped regions of a solar cell 200. In one embodiment, the P-type doped regions of a solar cell 200 electrically connect to a metal pad 203-1 and the N-type doped regions of the solar cell 200 electrically connect to a metal pad 203-2. Electrically connecting a metal pad 203-2 of a solar cell 200 to a metal pad 203-1 of another solar cell 200 thus serially connects the two solar cells 200 together.

Figure 7:
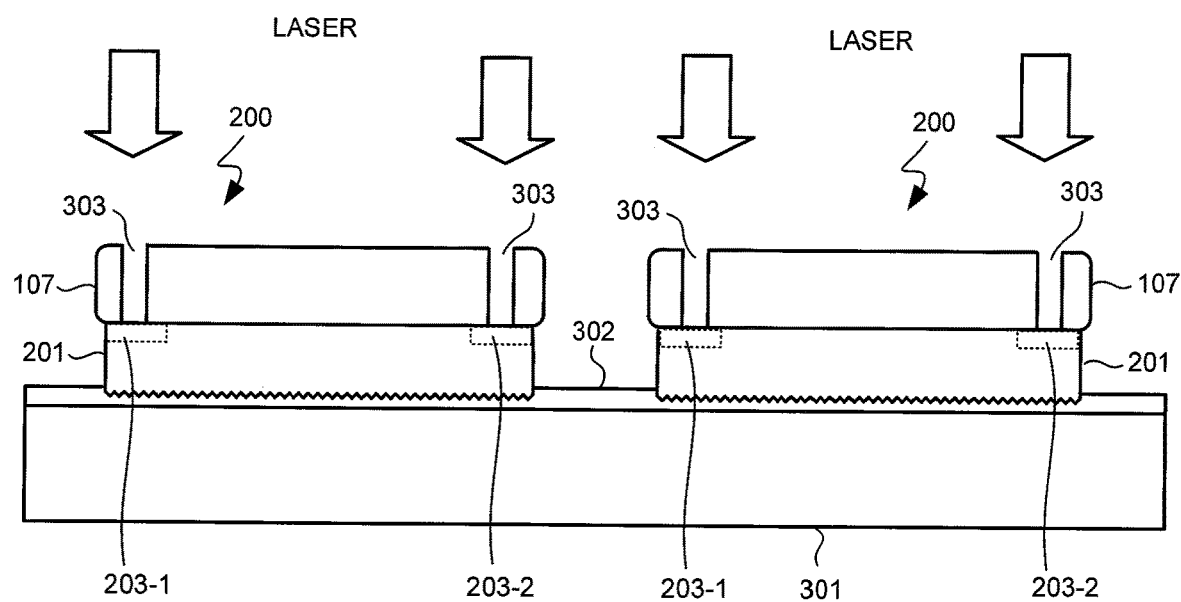

FIG. 7 shows vias 303 being formed through the carrier 107. A via 303 exposes a metal pad 203, thereby allowing electrical connection to the metal pad 203 and corresponding doped region of the solar cell 200. In one embodiment, the vias 303 are formed by a laser process. More particularly, a laser beam may be impinged on the carrier 107 to form a via 303. An optically transparent carrier 107 facilitates location of the metal pads 203 (e.g., by AOI alignment) by the laser system employed to form the vias 303. A metal pad 203 may serve as a laser stop during formation of a via 303, thereby advantageously preventing laser damage to underlying structures.

Figure 10:
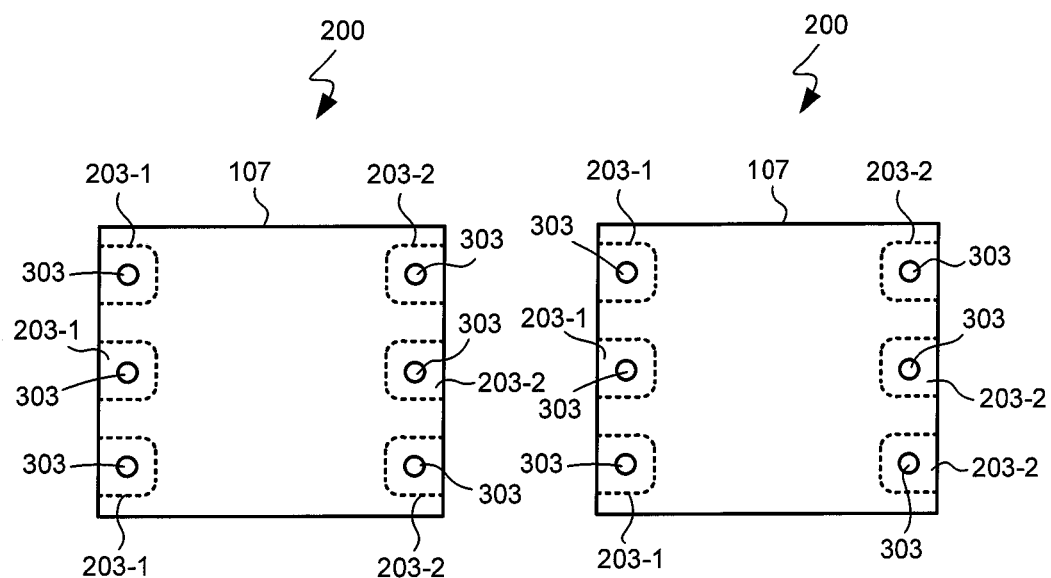
FIGS. 10 and 11 show plan views of solar cells in a solar cell module being fabricated in accordance with an embodiment of the present disclosure.

FIG. 10 schematically shows a plan view of the solar cells 200 after the laser process to form the vias 303 through the carriers 107. As shown in FIG. 10, the vias 303 may be formed over corresponding metal pads 203 through the carrier 107. In the example of FIG. 10, each solar cell 200 has six vias 303, one for each of the metal pads 203. As can be appreciated, the number of vias and metal pads may be varied depending on the particulars of the solar cell.

As can be appreciated, instead of forming vias 303 at the module level, the vias 303 may also be incorporated into a carrier 107 at the cell level. That is, the carrier 107 may already have the vias 303 before being placed on the transparent top cover 301. For example, the carrier 107 may include the vias 303 as formed on the backside of the solar cell 200. More specifically, the carrier 107 may be printed (e.g., by screen printing) on the backside of the solar cell 200 to include the vias 303. In that example, the carrier 107 may comprise a printable organic, such as polyimide. After the carrier 107 with the vias 303 is printed on the backside of the solar cell 200, the solar cell 200 is placed on the encapsulant 302.

Figure 8:
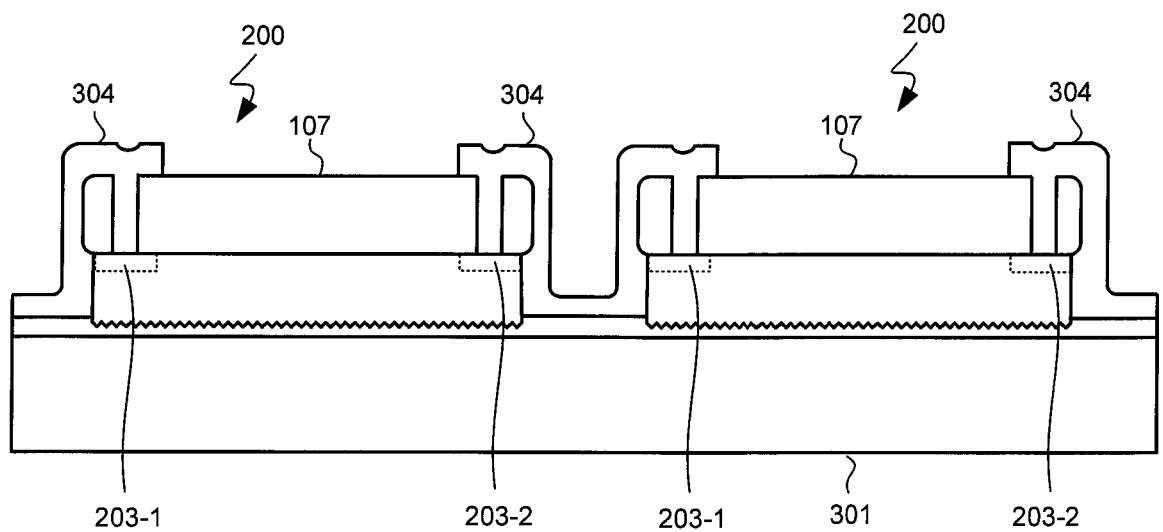

Continuing in FIG. 8, a metal connection 304 is formed to electrically connect one solar cell 200 to an adjacent solar cell 200 through the vias 303. In the example of FIG. 8, the metal connection 304 fills a via 303 of a first carrier 107 of a first solar cell 200 and a via 303 of a second carrier 107 of a second solar cell 200. The metal connection 304 extends between the vias 303 of the first and second carriers 107 to electrically connect a metal pad 203-2 of the first solar cell 200 to the metal pad 203-1 of the second solar cell 200. The metal connection 304 thus electrically connects the N-type doped region of the first solar cell 200 to the P-type doped region of the second solar cell 200 to electrically connect the first and second solar cells 200 in series.

Figure 11:
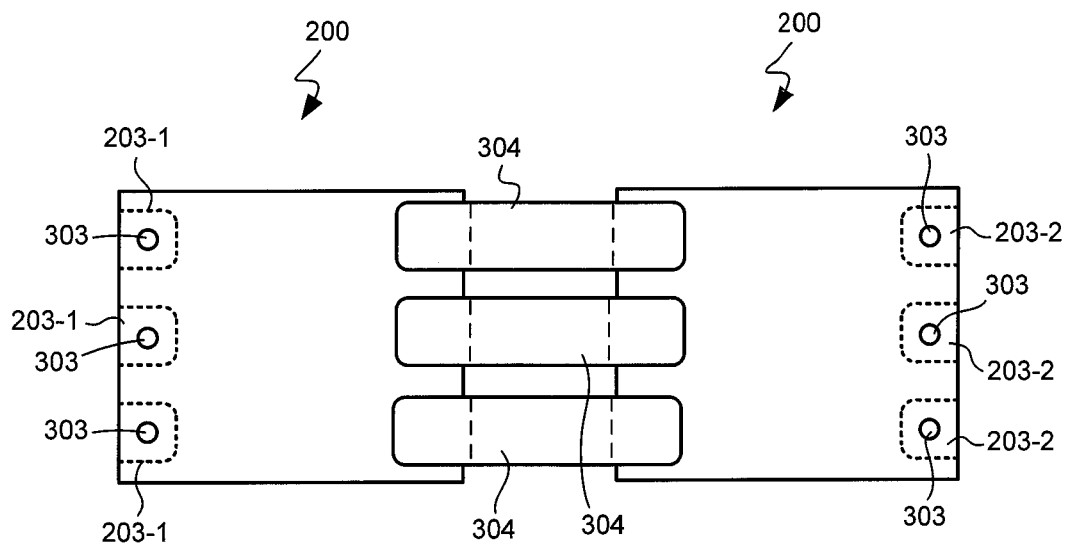

In one embodiment, a metal connection 304 may be formed by filling the vias 303 with electrically conductive paste (e.g., silver paste). The conductive paste may be applied on the carriers 107 to fill up and connect the vias 303 of adjacent solar cells 200 to form a metal connection 304 in the same step. For example, the conductive paste may be printed (e.g., by screen printing) into the vias 303 and between the solar cells 200 to form the metal connection 304. Alternatively, the metal connection 304 may also comprise a conductive tape that is applied and pressed into the vias 303 and between adjacent solar cells 200. In another embodiment, the vias 303 are filled by conductive paste or other metal in a first step and, in a second step, a conductive tape or metal interconnect is electrically connected to the filled vias 303 to form a metal connection 304 between adjacent solar cells 200. FIG. 11 schematically shows a plan view of the solar cells 200 after formation of the metal connections 304.

Figure 9:
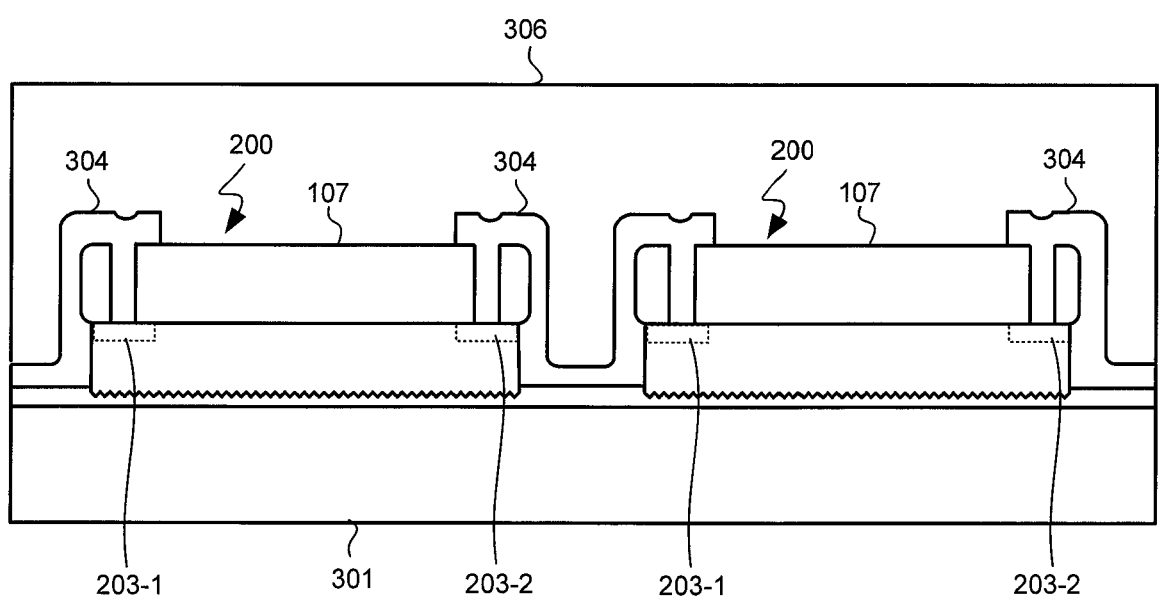

Continuing in FIG. 9, a rear cover 306 is attached to the backside of the solar cells 200. The rear cover 306 may comprise a roll tape or plastic sheet, among other examples, that provides bottom protection for the solar cell module.

Figure 12:
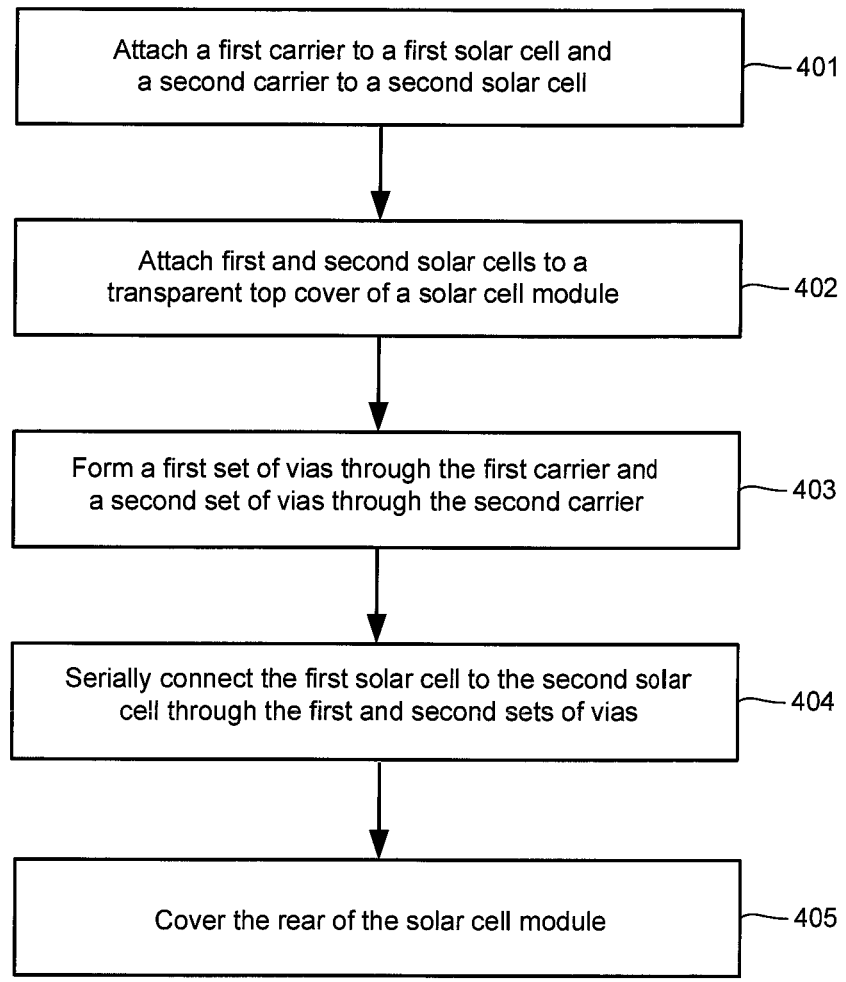
FIG. 12 shows a flow diagram of a method of fabricating a solar cell module in accordance with an embodiment of the present disclosure.

FIG. 12 shows a flow diagram of a method of fabricating a solar cell module in accordance with an embodiment of the present disclosure. The method of FIG. 12 may, in some embodiments, include additional or fewer blocks than illustrated.

In the example of FIG. 12, a first carrier is attached to a first solar cell and a second carrier is attached to a second solar cell (step 401). The first and second carriers may comprise a transparent dielectric material. The first carrier may be attached to a backside of the first solar cell, and the second carrier may be attached to a backside of the second solar cell. Thereafter, the first and second solar cells are attached to a transparent top cover of a solar cell module with their respective carriers in place (step 402). For example, the front sides of the first and second solar cells may be placed on an encapsulant, which in turn is placed on the transparent top cover. The first and second solar cells, the encapsulant, and the transparent top cover are then packaged together by lamination, for example.

A first set of vias may be formed through the first carrier and a second set of vias may be forming through the second carrier (step 403). The first and second set of vias may be formed through the first and second carriers, respectively, after the first and second solar cells are attached to the transparent top cover of the solar cell module. The first and second set of vias may also be formed with their respective carriers before the first and second solar cells are attached to the transparent top cover. Each via may expose an underlying metal pad of the corresponding solar cell.

The first solar cell is serially connected to the second solar cell through the first and second set of vias (step 404). For example, each via may be filled with a conductive material, and filled vias of adjacent solar cells may be electrically connected. The rear of the solar cell module may then be covered by a rear cover attached to the backsides of the solar cells (step 405).

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A solar cell, comprising:
   a plurality of doped regions;
   a dielectric layer that is disposed on the plurality of doped regions;
   a plurality of metal contacts that is disposed on the dielectric layer and is electrically connected to the plurality of doped regions through contact holes in the dielectric layer;
   a carrier disposed over the plurality of metal contacts, wherein the plurality of metal contacts is disposed between the dielectric layer and the carrier;
   a nonconductive bonding agent that bonds the carrier to the solar cell, the bonding agent being disposed between adjacent metal contacts of the plurality of metal contacts and between the carrier and the dielectric layer;
   a first set of vias in the carrier; and
   a first metal connection to an adjacent solar cell, the first metal connection being electrically connected to the adjacent solar cell through the first set of vias, wherein the dielectric layer does not directly contact the carrier.

2. The solar cell of claim 1, wherein the carrier is attached on a backside of the solar cell.

3. The solar cell of claim 2, wherein the carrier covers an entire backside of the solar cell.

4. The solar cell of claim 1, further comprising:
   a first set of metal pads of the solar cell, wherein the first metal connection is electrically connected to the first set of metal pads through the first set of vias;
   a second set of vias in the carrier; and
   a second metal connection that electrically connects to a second set of metal pads of the solar cell through the second set of vias.

5. The solar cell of claim 1, wherein the carrier comprises a material selected from the group consisting of optically transparent dielectric material, organic material, inorganic material and opaque material.

6. The solar cell of claim 1, wherein the carrier comprises a material selected from the group consisting of polyimide, polyethylene terephthalate and silicon carbide.

7. The solar cell of claim 1, wherein the first metal connection comprises a conductive tape.

8. The solar cell of claim 1, wherein the first metal connection comprises a conductive paste.

9. The solar cell of claim 1, wherein the first metal connection comprises a silver paste.

10. The solar cell of claim 1, wherein the first metal connection comprises a conductive paste in the first set of vias and a metal tape electrically connected to the first set of vias.

11. A solar cell module, comprising:
   a first solar cell and a second solar cell, each of the first and second solar cells comprising a plurality of doped regions, a dielectric layer that is disposed on the plurality of doped regions, and a plurality of metal contact fingers that is disposed on the dielectric layer and is electrically connected to the plurality of doped regions through contact holes in the dielectric layer;
   a first carrier disposed over the plurality of metal contact fingers of the first solar cell, the first carrier comprising a first set of vias;
   a first nonconductive bonding agent that bonds the first carrier to the dielectric layer of the first solar cell, the first nonconductive bonding agent being disposed between adjacent metal contact fingers and disposed between the first carrier of the first solar cell and the dielectric layer of the first solar cell;
   a second carrier disposed over the plurality of metal contact fingers of the second solar cell, the second carrier comprising a second set of vias;
   a second nonconductive bonding agent that bonds the second carrier to the dielectric layer of the second solar cell, the second nonconductive bonding agent being disposed between adjacent metal contact fingers and disposed between the second carrier of the second solar cell and the dielectric layer of the second solar cell; and a metal connection that electrically connects the plurality of doped regions of the first solar cell to the plurality of doped regions of the second solar cell through the first and second set of vias, wherein the dielectric layer of the first solar cell does not directly contact the first carrier, and the dielectric layer of the second solar cell does not directly contact the second carrier.

12. The solar cell module of claim 11, wherein the plurality of doped regions of each of the first and second solar cells comprises P-type and N-type doped regions.

13. The solar cell module of claim 11, wherein the first carrier is attached on a backside of the first solar cell and the second carrier is attached on a backside of the second solar cell.

14. The solar cell module of claim 11, wherein each of the first and second carriers comprises a material selected from the group consisting of optically transparent dielectric material, organic materials, inorganic materials and opaque material.

15. The solar cell module of claim 8, wherein the metal connection comprises a material selected from the group consisting of a conductive tape and a conductive paste.

16. A solar cell module, comprising:
a first solar cell coupled to a first carrier that has a first set of vias and is disposed over a plurality of metal contact fingers of the first solar cell, the plurality of metal contact fingers of the first solar cell being electrically connected to a plurality of doped regions of the first solar cell through a dielectric layer of the first solar cell, wherein the plurality of metal contact fingers of the first solar cell is disposed between the dielectric layer of the first solar cell and the first carrier;
a second solar cell coupled to a second carrier that has a second set of vias and is disposed over a plurality of metal contact fingers of the second solar cell, the plurality of metal contact fingers of the second solar cell being electrically connected to a plurality of doped regions of the second solar cell through a dielectric layer of the second solar cell,
wherein the plurality of metal contact fingers of the second solar cell is disposed between the dielectric layer of the second solar cell and the second carrier;
a metal connection that serially connects the first and second solar cells, the metal connection being electrically connected to the first solar cell through the first set of vias and to the second solar cell through the second set of vias; and
a transparent top cover, wherein the first and second solar cells are attached to the transparent top cover,
wherein the dielectric layer of the first solar cell does not directly contact the first carrier, and the dielectric layer of the second solar cell does not directly contact the second carrier,
wherein a first nonconductive bonding agent bonds the first carrier to the dielectric layer of the first solar cell, the first nonconductive bonding agent being disposed between adjacent metal contact fingers of the plurality of metal contact fingers of the first solar cell, and the first nonconductive bonding agent being disposed between the first carrier of the first solar cell and the dielectric layer of the first solar cell; and
wherein a second nonconductive bonding agent bonds the second carrier to the dielectric layer of the second solar cell, the second nonconductive bonding agent being disposed between adjacent metal contact fingers of the plurality of metal contact fingers of the second solar cell, and the second nonconductive bonding agent being disposed between the second carrier of the second solar cell and the dielectric layer of the second solar cell.

17. The solar cell module of claim 16, wherein the first and second carriers comprise a material selected from the group consisting of optically transparent dielectric material, organic materials, inorganic materials and opaque material.

18. The solar cell module of claim 16, wherein the metal connection comprises a material selected from the group consisting of a conductive tape and a conductive paste.

* * * * *